United States Patent
Foley et al.

(10) Patent No.: US 6,696,995 B1
(45) Date of Patent: Feb. 24, 2004

(54) LOW POWER DESERIALIZER CIRCUIT AND METHOD OF USING SAME

(75) Inventors: Sean Foley, Cork (IE); Bertrand J. Williams, Austin, TX (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 10/334,098

(22) Filed: Dec. 30, 2002

(51) Int. Cl.[7] ................................................. H03M 9/00
(52) U.S. Cl. ........................................ 341/100; 341/101
(58) Field of Search ................................. 341/100, 101

(56) References Cited

U.S. PATENT DOCUMENTS

| | | |
|---|---|---|
| 4,791,628 A | 12/1988 | Swartz |
| 4,926,423 A | 5/1990 | Zukowski |
| 5,128,940 A | 7/1992 | Wakimoto |
| 5,301,196 A | 4/1994 | Ewen et al. |
| 5,515,506 A | 5/1996 | Dixon |
| 6,288,656 B1 * | 9/2001 | Desai ........................ 341/100 |

* cited by examiner

*Primary Examiner*—Brian Young
(74) *Attorney, Agent, or Firm*—Kevin L. Daffer; Conley Rose P.C.

(57) ABSTRACT

A deserializer within, for example, a transceiver is provided having multiple stages of pipelined demultiplexers. Each demultiplexer within the earlier stages of the pipelined architecture use only three latches. Two latches are dedicated to producing an odd bitstream (or even bitstream) from odd and even bits within the incoming serial bitstream. Another latch is dedicated to producing an even bitstream (or odd bitstream) from even and odd bits of the serial bitstream. Using only three latches within early stages of the pipelined architecture reduces power consumption and overall size of the deserializer. Clocking signal frequencies of subsequent stages are reduced and the clocking signals are delayed in order to align data outputs from the previous stage with transitions of clocking signals forwarded to the respective stages.

20 Claims, 4 Drawing Sheets

LOW POWER DESERIALIZER CIRCUIT AND METHOD OF USING SAME

BACKGROUND OF THE INVENTION

1. Field of the Invention

This invention relates to electronic circuitry and, more particularly, to a deserializer that contains multiple 1-to-2 demultiplexing cells ("demultiplexers") arranged in stages, wherein each demultiplexer contains fewer circuit elements and consumes less power than a conventional 1-to-2 demultiplexer.

2. Description of the Related Art

The following descriptions and examples are not admitted to be prior art by virtue of their inclusion within this section.

Communication between nodes of a communication system typically involves a serial bitstream. The bitstream can be formatted in numerous ways and is sent across a wire or wireless medium between nodes of the network. Examples of serial bitstream transfer protocols include Ethernet and Synchronous Optical Network ("SONET"), as well as numerous others.

An integral part of the serialized communication between nodes is the transceiver associated with each node. A transceiver, having both a receiver and a transmitter, functions not only to recognize the protocols which envelop the packets of serialized data, but also convert the serial bitstream to multiple bitstreams, if necessary. The conversion from a relatively high bit rate serial bitstream to a parallel set of relatively low bit rate parallel bitstreams takes place within a receiver, and is oftentimes referred to as deserialization. Conversely, the conversion from parallel bitstreams to a serial bitstream occurs within a transmitter, and is oftentimes referred to as serialization.

The serializer and deserializer of the transceiver are normally found within the physical media attachment ("PMA") sublayer of the transceiver. The serializer/deserializer is responsible for supporting multiple encoding or protocol schemes and allowing presentation of those encoding schemes to the upper layers of, for example, the Open System Interconnection ("OSI") model. As the bit transfer rate of the serial bitstream increases, power consumption within the serializer/deserializer can also substantially increase. This is due, in part, to the time-division multiplexing and demultiplexing operations that must take place at a rate at or near the bit transfer rate.

At slower bit rates, shift registers can be used. As the serial bitstream is received on the shift registers, a clock signal shifts the serial bits into the registers and outputs the corresponding parallel bitstreams from each stage of the register. A state machine can be used to output the parallel bits into another register at predetermined times. As the bit rate increases, however, clocking the data storage elements of the shift registers at full, or even half rates, can consume substantial amounts of power within the deserializer.

A popular form of deserializer which can operate at slower clock rates is oftentimes referred to as a pipelined deserializer. A pipelined deserializer essentially arranges the demultiplexers into stages. Each stage can be clocked by a successively slower clock rate. This allows for a majority of the demultiplexing cells, especially in the back-end stages, to operate at much slower clock speeds than the speed at which the serial bitstream is transferred.

While a pipelined deserializer has power saving advantages over conventional shift registers and state machines that are clocked at substantially the same rate as the serial bitstream, pipelined deserializers typically use multiple latches within each demultiplexing cell. Regardless of the clock rate, a demultiplexing cell that has excessive data storage elements (or latches) consumes a great deal more power than a cell having fewer latches. However, typical demultiplexers of a pipelined deserializer are generally limited to having a minimum number of latches and, therefore, are constrained to having a minimum power consumption level that can be intolerable in many applications. For example, if a deserializer is called upon to deserialize bitstreams exceeding one or more Gbits/sec., then conventional demultiplexers found within rather large 1-to-n (where n is large) deserializers will consume undesirable amounts of power in, for example, portable applications.

It would be desirable to introduce a demultiplexer cell, or demultiplexer, within a pipelined deserializer that consumes less power than conventional demultiplexers. It would also be desirable to make the overall demultiplexer small so as to reduce the fan out requirements of any clock signal input to each of the components of the demultiplexer. A smaller and less power consumptive demultiplexer can be used in large 1-to-n deserializers, where n might exceed 16, 32, or even 64 parallel bitstreams.

SUMMARY OF THE INVENTION

The problems outlined above are in large part solved by introducing an improved deserializer that uses smaller and less power consumptive demultiplexers arranged in stages within a pipelined architecture. Each demultiplexer is the same and uses no more than three latches. It may be desirable, however, in the last stage of the deserializer, that special demultiplexers be used, each of which might preferably have no more than three latches. The early stage or stages of the pipelined architecture, however, use a demultiplexer having no more than three latches.

Placing the three-latch demultiplexers within the early stages of a deserializer addresses the primary culprit of power consumption within the deserializer. Specifically, in a pipelined deserializer, the first stage will be clocked at the maximum clocking frequency of the deserializer. The clocking frequency of the latches within the first stage is preferably one-half frequency of the serial bitstream. The latches within each successive stage will operate at one-half the preceding stage. Thus, by utilizing three-latch demultiplexers within the early stages, the overall power consumption of the deserializer is substantially reduced. The latter stages would operate at clocking frequencies that might be so slow that regardless of the number of latches, the overall power consumption attributable to those stages would be relatively inconsequential.

A latch is herein referred to as a single storage element. Most conventional demultiplexers use a flip-flop instead of a latch. Specifically, conventional demultiplexers utilize two flip-flops coupled in parallel to receive the serial bitstream. Each flip-flop will thereby produce a corresponding odd-bit serial bitstream or even-bit serial bitstream to effectuate a 1-to-2 demultiplexer. Contrary to a latch having a single storage element, a flip-flop generally has two storage elements connected in series. The first storage element is often referred to as the master latch, and the second storage element is often referred to as the slave latch.

The master and slave latches are typically clocked by complementary clock signals. Employing two master-slave flip-flops, each comprising a pair of latches would therefore constitute four latches instead of the three-latch present design. In addition, since there would be a discrepancy in the phase outcome from the pair of flip-flops, an additional latch would be needed at the output of one of the flip flops to increase the conventional demultiplexer size to five latches, rather than the present three latches. Using three latches rather than five latches at the early stages of the pipelined deserializer will significantly increase the overall size of the deserializer, as well as the power consumption and clock fan out of the deserializer.

Broadly speaking, the present invention contemplates a deserializer and a demultiplexer formed as part of a transceiver, for example. The transceiver can be any device which performs a serializer/deserializer function. The contemplated deserializer could, if necessary, simply operate in reverse as a serializer.

According to one embodiment, the demultiplexer includes a first latch, a second latch, and a third latch. The first and second latches are coupled in series, with an input of the first latch adapted to receive a serial bitstream and the output of the second latch adapted to latch a pair of bits within the serial bitstream onto an output of the demultiplexer. The pair of bits are separated in time by an intervening bit which is not placed on the output of the second latch. Instead, the intervening bit is produced from an output of a third latch. The third latch is coupled in parallel to the first and second latches in order to receive the serial bitstream, similar to the first latch receiving the serial bitstream.

The demultiplexer consists of no more than three latches. A pair of bits arising from the second latch consists of two bits within a series of odd bits of the serial bitstream, and the intervening bit from the output of the third latch consists of one bit within a series of even bits. The odd and even bits are interleaved with one another in order to represent each and every bit within the serial bitstream. The second and third latches preferably receive a common clock signal, and the first latch receives an inverse of that common clock signal. In addition to outputting even and odd bits, the output from the demultiplexer preferably consumes almost the entirety of a cycle of the common clock signal, even though the common clock signal preferably transitions at substantially one-half the bit rate of the serial bitstream.

According to yet another embodiment, a deserializer is provided. The deserializer includes a first demultiplexer, a second demultiplexer, and a third demultiplexer. The first demultiplexer can be found within a first stage that feeds into a second stage. The second and third demultiplexers can be found within the second stage, and are connected in parallel to receive respective odd bits and even bits produced from the first demultiplexer. Preferably, the first, second, and third demultiplexers are substantially the same and each comprise no more than three latches.

The first stage having the first demultiplexer is preferably clocked at one-half the bit rate of the serial bitstream. The second stage having the second and third demultiplexers is clocked by a second clock signal that transitions at preferably one-quarter the bit rate of the serial bitstream. In addition to the second clock being at one-half the frequency of the first clock, the second clock signal is delayed relative to the first clock signal. The amount of delay is preferably less than one-half clock cycle of the second clock signal.

According to yet another embodiment, a method is provided. The method involves deserializing a bitstream by generating a pair of interleaving bitstreams from the bitstream using no more than three latches that are clocked by a first clock signal. Thereafter, another pair of interleaving bitstreams are generated from each of the pair of interleaving bitstreams using no more than three latches that are clocked by a second clock signal transitioning at one-half the frequency of the first clock signal and delayed relative to the first clock signal. The amount of delay is preferably chosen so that the second clock signal can have transitions that are aligned with valid bits coming from the upstream or preceding stage or stages. By delaying the second clock signal relative to the first clock signal, invalid data that was sampled in the preceding stage is not-sampled in the successive stage.

BRIEF DESCRIPTION OF THE DRAWINGS

Other objects and advantages of the invention will become apparent upon reading the following detailed description and upon reference to the accompanying drawings in which.

Figure 1:
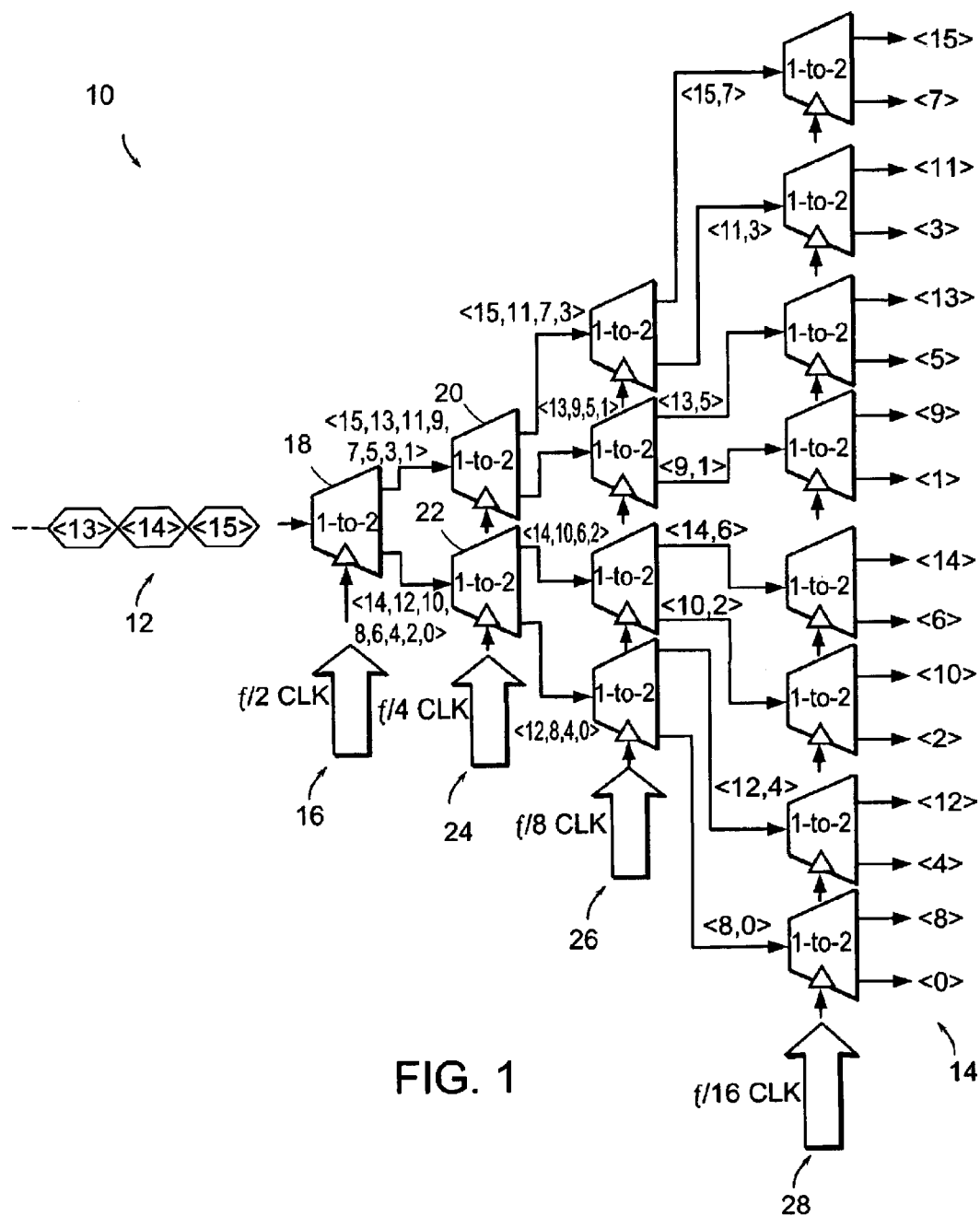
FIG. 1 is circuit schematic diagram of a 1-to-n deserializer containing n–1demultiplexers connected in stages.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF PREFERRED EMBODIMENTS

Turning now to the drawings, FIG. 1 illustrates a deserializer 10. Deserializer 10 can form a part of a data transceiver circuit and, specifically, the serializer/deserializer part. It is envisioned, however, that deserializer 10 can have far broader applications and can essentially be used in any circuit that receives serialized data or a serial bitstream 12, and produces multiple, parallel bitstreams 14. Merely as an example, deserializer 10 is shown as a 1-to-16 deserializer. Sixteen bits (bit0–bit16) can be fed into a first stage 16 that is clocked by a clock signal transitioning at one-half the frequency of the serial bitstream. Demultiplexer 18 within first stage 16 will separate the odd bits from the even bits, as shown, and place the respective odd and even bitstreams into demultiplexers 20 and 22, respectively, of second stage 24. A second clock signal is used to synchronize demultiplexers 20 and 22, and transitions at one-half the frequency of the first clock signal used by demultiplexer 18.

The pipelined deserializer 10 is shown having four stages 16, 24, 26, and 28. Of course, there may be more or less than four stages, depending on the size of the deserializer and the number of bits within the incoming serial bitstream 12 that must be placed on individual parallel outputs 14. Each successive stage is shown having twice the number of demultiplexers than the previous stage, and each successive stage is clocked by a clocking signal that transitions at one-half the frequency of the previous stage clock signal. It is recognized that if more than 16 bits must be deserialized, then more than four stages will be required. For example, five stages could deserialize a 32-bit word and a six stage deserializer could deserialize a 64-bit word, and so forth.

Figure 2:
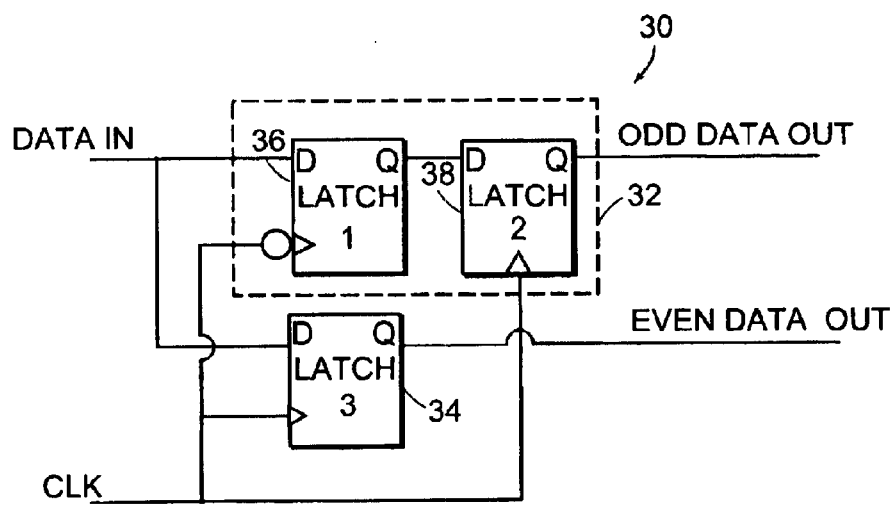
FIG. 2 is a circuit schematic diagram of a demultiplexer utilizing three latches.

FIG. 2 illustrates a demultiplexer 30. Demultiplexer 30 is common to all 1-to-2 demultiplexers shown in FIG. 1, except for possibly demultiplexers in the last stage. Thus, demultiplexers 18, 20, and 22 of FIG. 1 can be identical and is represented as reference numeral 30 of FIG. 2. Demultiplexer 30 includes a two-latch, edge-triggered, master-slave, D-type flip-flop 32 coupled in parallel to a single latch 34. Latches 36 and 38 of flip-flop 32 are shown receiving complementary clock signals. Latch 36 is hereinafter referred to as the first latch, latch 38 is the second latch, and latch 34 is the third latch. The first and third latches 36 and 34 concurrently receive the serial bitstream input into the demultiplexer 30, with an output from first latch 36 being fed to second latch 38. Second latch 38 thereafter latches the output of the first latch and presents the latched output as, for example, even bits ("EVEN DATA OUT") within the input serial bitstream, shown as "DATA IN." The output from third latch 34 is shown as the even bits ("EVEN DATA OUT") of the input serial bitstream.

Figure 3:
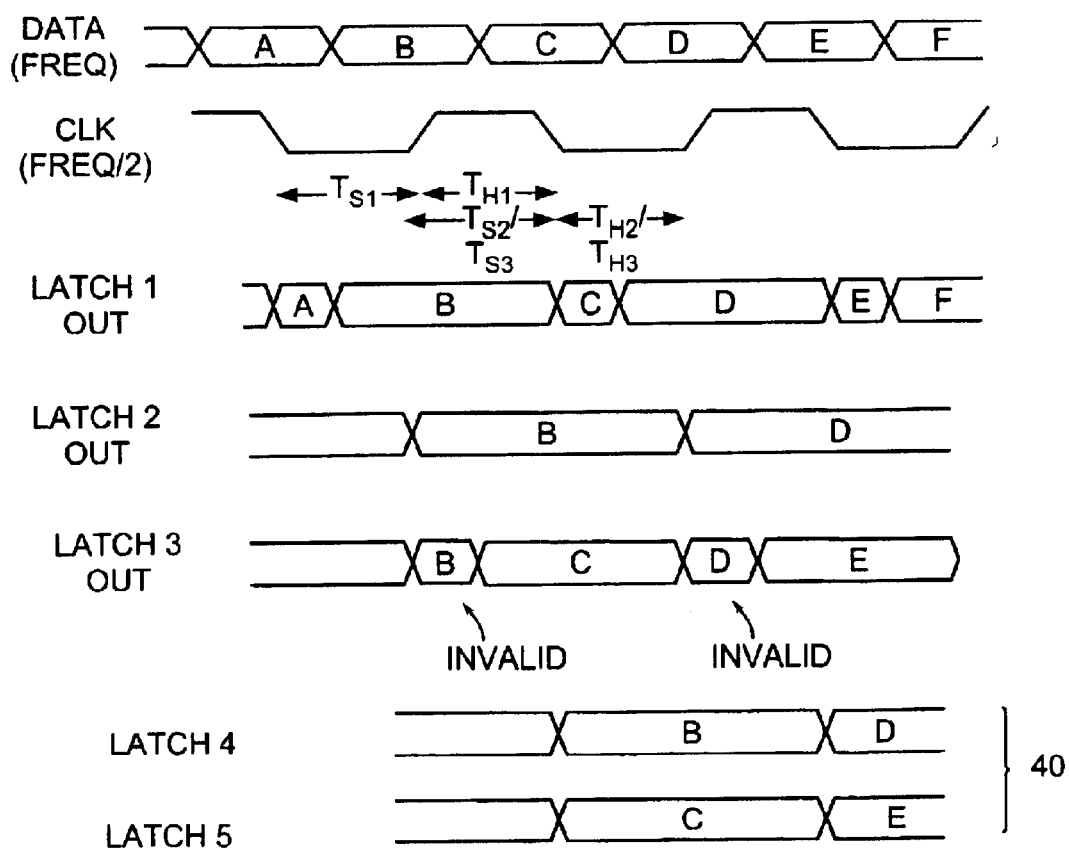
FIG. 3 is a timing diagram of the output produced from the demultiplexer of FIG. 2 compared to a demultiplexer having an additional pair of latches.

Referring to FIGS. 2 and 3, in combination, the clock signal forwarded to the first and third latches 36 and 34 is preferably delayed relative to transitions of the serial bitstream, and is at preferably delayed one-half cycle of the serial bitstream input to the first and third latches. The first latch 36 will sample bit A on the negative-going edge of the clock signal ("CLK"). As bit A terminates and bit B begins, the first latch 36 will latch to bit B when bit B arrives since the clock signal remains at a low voltage level when bit B occurs. As the clock signal transitions to a high voltage level, bit B will be held at the output of the first latch 36 as shown ("LATCH1 OUT"). Thus, first latch 36 samples data at the low voltage levels of the clock signal and holds the previously sampled data at the high voltage levels of the clock signal as shown by $T_{S1}$ and $T_{H1}$, respectively.

Output from the first latch 36 is input to the second latch 38, with second latch 38 being positive-level triggered. Specifically, bit B output from the first latch will be sampled at time $T_{S2}$. Since bit C output from the first latch does not occur until after the sample duration time $T_{S2}$ has ended, then only bit B will be held at the output of the second latch ("LATCH2 OUT") at during time $T_{H2}$. The third latch operates similar to the first latch, except that sampling occurs at the high voltage values of the clock. Thus, a last portion of bit B will be sampled followed by a first portion of bit C at time $T_{S3}$. Sampled bit C will remain at the output of the third latch ("LATCH3 OUT") during the hold time $T_{H3}$.

The process by which bits are latched by the first, second, and third latches repeat as shown in FIG. 3, with every other bit of the serial bitstream (i.e., the odd bits B, D, etc.) being produced from the second latch and intervening every other bit (i.e., the even bits C, E, etc.) being produced from third latch 34. Of course, the opposite could be true-even bits produced from the second latch and odd bits produced from the third latch, if desired.

An outcome of using only a single latch instead of a two-latch, master-slave D-type flip flop is that there will be instances in which invalid data is output from the single latch, as shown by the "INVALID" indicators of FIG. 3. As a positive level-triggered latch, third latch 34 samples whatever data is present when the clock goes high and holds the previously sampled data when the clock goes low. If the third latch output were fed into another latch that is triggered opposite the third latch (i.e., receives a complementary clock signal to that of the third latch), then output from the fourth latch would not contain periodic instances of invalid data. This result occurs from the second latch, when a first latch is placed before the second latch.

While using two latches in series to form a D-type flip-flop on both branches of the serial bitstream would eliminate invalid data, introducing an additional latch would significantly increase power consumption, especially in the early stages of the pipelined deserializer. For example, conventional demultiplexers such as those illustrated in U.S. Pat. No. 5,128,940, herein incorporated by reference, utilize not only four latches (two D-type flip-flops), but might also include an additional latch totaling five latches. The fifth latch will essentially delay the output of the top D-type flip-flop so that the odd bits coincide and are in phase with the even bits output from the lower D-type flip-flop to produce the waveforms shown as item 40 of FIG. 3. The waveform of the odd bits B and D arise from a fourth latch coupled to the output of a D-type flip-flop to produce the odd bits. A fifth latch would be used to output the even bits and, in combination with a third latch, would produce the second D-type flip-flop.

Figure 4:
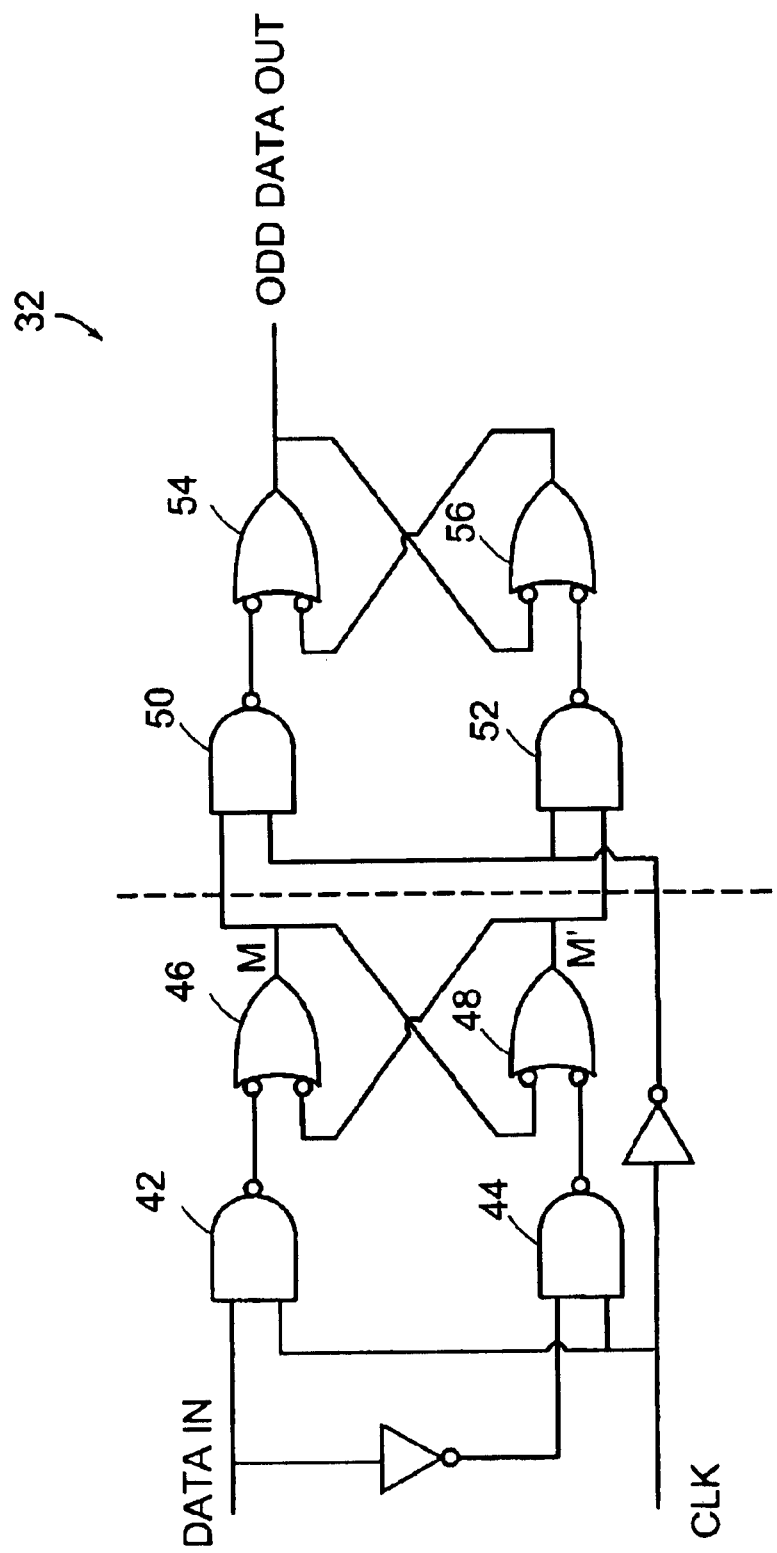
FIG. 4 is a circuit schematic of a two latch, master-slave D-type flip flop.

FIG. 4 illustrates one example of a master-slave, negative-edge triggered D-type flip-flop 32 of FIG. 2. Of course, there can be numerous other ways in which to implement flip-flop 32. While the clock signal is high, gates 42 and 44 are enabled, thereby forcing the master latch (gates 46 and 48) to the same state as the D input (i.e., M =D input and M'=D'input). Gates 50 and 52 are disabled at that time so that the slave latch 54 and 56 retains its previous state. When the clock signal goes low, the inputs to the master latch 46 and 48 are disconnected from the D input, while the inputs to the slave latch 54 and 56 are simultaneously coupled to the outputs of the master. The master thereby transfers its state to the slave and no further changes can occur at the output because the master is now disconnected. At the next rising edge of the clock signal, the slave will be decoupled from the master latch and will retain its state, while the master latch will once again follow the serial bitstream of the D input.

FIG. 4 illustrates that an edge-triggered master-slave D-type flip-flop implements two latches. Instead of introducing an edge-triggered master-slave D-type flip-flop having two latches fed into another latch to produce the odd bitstream, and yet another edge-triggered master-slave D-type flip-flop having two latches to produce the even bitstream, the present demultiplexer 30 simply uses one D-type flip-flop having two latches to produce the odd bitstream and only a single latch to produce the even bitstream.

Figure 5:
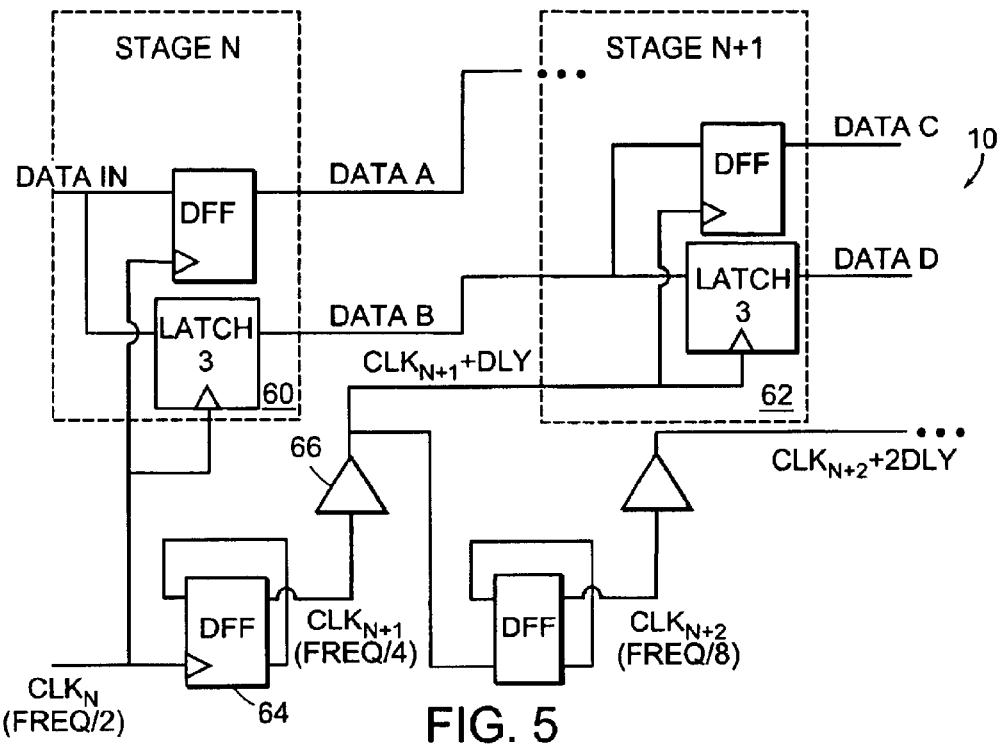
FIG. 5 is a circuit schematic diagram of two demultiplexers of FIG. 2 coupled in successive stages of a deserializer.

FIG. 5 illustrates only a portion of deserializer 10. Specifically, the portion shown includes a demultiplexer 60 having an output connected to an input of another demultiplexer 62. Demultiplexer 60 is preferably placed in a stage preceding the stage in which demultiplexer 62 is placed. The serial bitstream is fed into demultiplexer 60 and, specifically, into the D-type flip-flop pair of latches and the third latch of demultiplexer 60. The output from the third latch of demultiplexer 60 is shown as DATA B. DATA B is then fed into the D-type flip-flop and the third latch of demultiplexer 62, where DATA C and DATA D are produced.

Demultiplexer 60 is clocked by a clock signal that has a frequency one-half the frequency of the serial bitstream forwarded into stage N. There may be multiple ways in which the first clock signal can be divided. For example, the first clock signal can be divided by a D-type flip-flop 64 so that the latches used in the demultiplexer 60 and the data and clock phase relationship can be controlled. The first clock signal is divided at the output of D-type flip-flop 64. The divided first clock, however, is delayed by a buffer 66 before it is placed into the subsequent stage demultiplexer 62. A buffer-tree can be used as part of the clock fan out to buffer the divided clocks into the subsequent stages.

Figure 6:
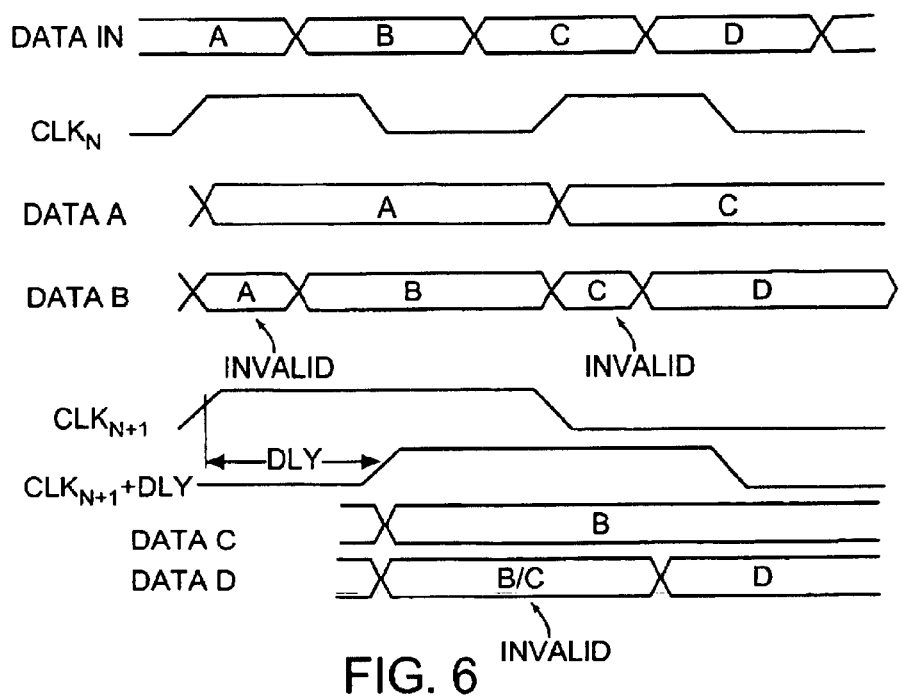
FIG. 6 is a timing diagram of the output produced from the two demultiplexers of FIG. 5, along with a delayed clock used to synchronize with the output.

Referring to FIGS. 5 and 6 in combination, odd bits A and C are forwarded as part of DATA A, and the even bits B and D are forwarded as part of DATA B. DATA B also contains unwanted, or invalid data, as shown. In order to remove the invalid data, the clock signal of the subsequent stage is delayed by an amount shown as DLY. The amount of delay of the second clock ensures that the second clock transitions, and thereby samples, only during the valid bits input thereto from the upstream stage. Thus, the invalid bits A and C within DATA B precede the delayed second clock signal transitions and thus are not sampled. DATA C therefore contains only bit B and not invalid bits A and C. DATA D will generate invalid data since a single latch is used to produce that data; yet, however, the invalid data will be removed in a subsequent stage using a delayed third clocking signal. The invalid data within DATA D is shown.

One skilled in the art would appreciate, after reading this disclosure, that the benefits of using only a single D-type flip-flop of two latches and simply adding one additional (i.e., third) latch to the demultiplexer will significantly reduce power consumption and overall size of the deserializer when connected in a pipelined architecture. Reduction in power consumption will be most prevalent when implementing only three latches at the earlier stages of the pipelined architecture. If desired, the latter stages or the final stage can use five latches, rather than three. If so, the clock signal used to synchronize the latter stages is relatively slow and, therefore, the addition of two more latches in one or more latter stages would not dramatically increase the overall power consumption of the deserializer. It is most important, however, that if power consumption savings is needed, then fewer latches be used in the earlier stages (especially the earliest stage) of the pipelined architecture, rather than at the latter stages. Moreover, the clock buffering necessary to drive the clock signals through each of the lessened number of latches will also be reduced. This, again, significantly reduces power consumption and silicon area of the overall chip design. Instead of requiring 5(n−1) latches to form a 1-to-n demultiplexing function, the present architecture uses 3(n−1) latches if all demultiplexers have reduced size. If the last stage contains four latches, rather than three, then the overall deserializer would have 3(n−1)+n latches. The clock divider used to produce the various clock signals for each stage can simply be D-type flip-flops or a series of toggle flip-flops connected together to form a 4-bit binary ripple counter.

To summarize, the incoming serial bitstream is forwarded to the data inputs of the first and third latches. The first and second latches combine to form, e.g., a positive-edge triggered D-type flip-flop. This D-type flip-flop clocks the data on the rising edge of the clock, thus capturing the odd (or even) bits. The transparent-when-high, e.g., third latch on the bottom row latches the data on falling edge of the clock, thus capturing the even (or odd) bits. As shown, there are sections of the even (or odd) data bits where the data is invalid. This leads to the multiplexed data bits in the even bitstream being shorter than, and out of phase with, those in the odd bitstream. However, in a pipelined system, this is taken care of by positioning the edges of the divided clock that gets fed to the subsequent stage using the delay buffers. In this fashion, bits are correctly grabbed and demultiplexed by subsequent stages of the pipeline.

What is claimed is:

1. A demultiplexer, comprising:

a first latch and a second latch coupled in series, wherein an input of the first latch is adapted to receive a serial bit stream and the output of the second latch is adapted to latch a pair of bits within the serial bit stream separated in time by an intervening bit; and a third latch coupled in parallel to the first and second latches, wherein the input of the third latch is adapted to receive the serial bit stream and latch the intervening bit.

2. The demultiplexer as recited in claim 1, wherein the demultiplexer consist of no more latches than the first, second and third latches.

3. The demultiplexer as recited in claim 1, wherein the pair of bits consists of two bits within a series of odd bits of the serial bit stream and the intervening bit consists of one bit within a series of even bits interleaved with the odd bits of the serial bit stream.

4. The demultiplexer as recited in claim 1, wherein the second and third latches receive a common clock signal and the first latch receives an inverse of the common clock signal.

5. The demultiplexer as recited in claim 4, wherein the second latch is further adapted to output each of the pair of bits during substantially the entirety of a cycle of the common clock signal, and wherein the third latch is further adapted to output the intervening bit during only a portion of a cycle of the common clock.

6. The demultiplexer as recited in claim 4, wherein the common clock signal transitions at substantially one half a bit rate of the serial bit stream.

7. A deserializer, comprising:

a first demultiplexer adapted to receive a bit stream of interleaved odd and even bits and produce a bit stream of odd bits and another bit stream of even bits;

a second demultiplexer coupled to receive only odd bits from the first demultiplexer and produce a first output bit stream of a first set of every other one of the odd bits and a second output bit stream of a second set of every other one of the odd bits interleaved between the first set;

a third demultiplexer coupled to receive only even bits from the first demultiplexer and produce a third output bit stream of a first set of every other one of the even bits and a fourth output bit stream of a second set of every other one of the even bits interleaved between the first set; and wherein the first, second and third demultiplexers are substantially the same and each comprise no more than three latches.

8. The deserializer as recited in claim 7, further comprising a clock signal sent to the first demultiplexer at one half the bit rate of the serial bit stream.

9. The deserializer as recited in claim 7, further comprising a first clock signal sent to the first demultiplexer at one half the bit rate of the serial bit stream and a second clock signal sent to the second and third demultiplexers at one quarter the bit rate of the serial bit stream.

10. The deserializer as recited in claim 9, wherein the second clock signal is delayed before forwarding the second clock signal to the second and third demultiplexers.

11. The deserializer as recited in claim 10, wherein the amount of delay is less than one half the clock cycle of the second clock signal.

12. The deserializer as recited in claim 7, wherein the first demultiplexer is within a first stage of a pipelined said deserializer and the second and third demultiplexers are within a second stage coupled subsequent to the first stage.

13. The deserializer as recited in claim 12, further comprising a stage coupled subsequent the second stage that comprises more than three latches.

14. The deserializer as recited in claim 13, wherein the stage is the last stage within a plurality of stages that comprise the deserializer.

15. A method for deserializing a bit stream, comprising:
generating a pair of interleaving bit streams from the bit stream using no more than three latches that are clocked by a first clock signal; and
generating another pair of interleaving bit streams from each of the pair of interleaving bit streams using no more than three latches that are clocked by a second clock signal transitioning at one half the frequency of the first clock signal and delayed relative to the first clock signal.

16. The method as recited in claim 15, wherein the amount of delay is equal to less than one half cycle of the second clock signal.

17. The method as recited in claim 15, wherein said generating the pair of interleaving bit streams comprises latching a bit duration for each bit within the pair of interleaving bit steams that extends for a duration less than a cycle of the first clock signal.

18. The method as recited in claim 15, wherein said generating the pair of interleaving bit streams comprises latching a bit duration for each bit within the pair of interleaving bit steams that extends for a duration substantially equal to a cycle of the first clock signal.

19. The method as recited in claim 15, wherein said generating another pair of interleaving bit streams comprises latching a bit duration for each bit within the another pair of interleaving bit streams that extends for a duration less than a cycle of the second clock signal.

20. The method as recited in claim 15, wherein said generating another pair of interleaving bit streams comprises latching a bit duration for each bit within the another pair of interleaving bit streams that extends for a duration substantially equal to a cycle of the second clock signal.

* * * * *

UNITED STATES PATENT AND TRADEMARK OFFICE
CERTIFICATE OF CORRECTION

PATENT NO.   : 6,696,995 B1
DATED        : February 24, 2004
INVENTOR(S)  : Foley et al.

It is certified that error appears in the above-identified patent and that said Letters Patent is hereby corrected as shown below:

Column 9,
Line 1, please delete "desenializer" and substitute therefor -- deserializer --.
Line 12, after the phrase "stage coupled subsequent," please insert -- to --.

Column 10,
Line 13, please delete "bit steams" and substitute therefor -- bit streams --.

Signed and Sealed this

Fourteenth Day of September, 2004

JON W. DUDAS
*Director of the United States Patent and Trademark Office*

UNITED STATES PATENT AND TRADEMARK OFFICE
CERTIFICATE OF CORRECTION

PATENT NO. : 6,696,995 B1
DATED : February 24, 2004
INVENTOR(S) : Foley et al.

It is certified that error appears in the above-identified patent and that said Letters Patent is hereby corrected as shown below:

Column 9,
Line 1, please delete "desenializer" and substitute therefor -- deserializer --.
Line 12, after the phrase "stage coupled subsequent," please insert -- to --.

Column 10,
Line 13, please delete "bit steams" and substitute therefor -- bit streams --.

Signed and Sealed this

Fifth Day of October, 2004

JON W. DUDAS
*Director of the United States Patent and Trademark Office*